United States Patent
Li et al.

(10) Patent No.: US 11,650,637 B2
(45) Date of Patent: May 16, 2023

(54) WIRING STRUCTURE, PREPARATION METHOD THEREOF, AND DISPLAY DEVICE

(71) Applicant: BOE Technology Group Co., Ltd., Beijing (CN)

(72) Inventors: Haixu Li, Beijing (CN); Zhanfeng Cao, Beijing (CN); Ke Wang, Beijing (CN); Jianguo Wang, Beijing (CN)

(73) Assignee: BOE Technology Group Co., LTD., Beijing (CN)

( * ) Notice: Subject to any disclaimer, the term of this patent is extended or adjusted under 35 U.S.C. 154(b) by 344 days.

(21) Appl. No.: 16/643,919

(22) PCT Filed: Aug. 14, 2019

(86) PCT No.: PCT/CN2019/100659
§ 371 (c)(1),
(2) Date: Mar. 3, 2020

(87) PCT Pub. No.: WO2020/035008
PCT Pub. Date: Feb. 20, 2020

(65) Prior Publication Data
US 2021/0064104 A1 Mar. 4, 2021

(30) Foreign Application Priority Data
Aug. 15, 2018 (CN) .......................... 201810928918.0

(51) Int. Cl.
*G06F 1/18* (2006.01)
*G02F 1/1362* (2006.01)
(Continued)

(52) U.S. Cl.
CPC ........ *G06F 1/189* (2013.01); *G02F 1/136295* (2021.01); *H05K 1/11* (2013.01);
(Continued)

(58) Field of Classification Search
CPC ..... G06F 1/189; G02F 1/136295; H05K 1/11; H05K 3/02; H05K 3/108; H05K 3/188;
(Continued)

(56) References Cited

U.S. PATENT DOCUMENTS 7,846,838 B2 * 12/2010 Knobloch ........... H01L 51/0022
438/678
9,990,940 B1 * 6/2018 Kang .................. G11B 5/7379
(Continued)

FOREIGN PATENT DOCUMENTS

| CN | 101016639 A | 8/2007 |
| CN | 105407648 A | 3/2016 |

(Continued)

OTHER PUBLICATIONS

International search report of PCT application No. PCT/CN2019/100659 dated Nov. 12, 2019.
(Continued)

*Primary Examiner* — Edward Chin
(74) *Attorney, Agent, or Firm* — Lippes Mathias LLP (57) ABSTRACT

The present disclosure provides a wiring structure, a preparation method thereof, and a display device. The wiring structure includes a substrate; a pre-arranged layer located on the substrate; and an electrode wiring covering the pre-arranged layer; wherein in the direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located.

16 Claims, 9 Drawing Sheets

(51) Int. Cl.
*H05K 1/11* (2006.01)
*H05K 3/02* (2006.01)
*H05K 3/10* (2006.01)
*H05K 3/18* (2006.01)

(52) U.S. Cl.
CPC .............. *H05K 3/02* (2013.01); *H05K 3/108* (2013.01); *H05K 3/188* (2013.01)

(58) Field of Classification Search
CPC .......... H05K 2201/09045; H05K 2201/09781; H05K 2201/09909; C25D 5/022; C25D 7/00; H01L 21/4889; H01L 23/49; H01L 21/4846; H01L 23/498
See application file for complete search history.

(56) References Cited

U.S. PATENT DOCUMENTS

| 2004/0263756 | A1* | 12/2004 | Tak ................... | G02F 1/133707 |
| | | | | 349/145 |
| 2009/0290115 | A1* | 11/2009 | Song ................. | G02F 1/134336 |
| | | | | 349/139 |
| 2013/0287935 | A1* | 10/2013 | Tsang .................. | H05K 1/0271 |
| | | | | 427/97.4 |
| 2017/0133336 | A1* | 5/2017 | Oliver .................... | H01L 27/18 |
| 2018/0151525 | A1* | 5/2018 | Cheng ............... | H01L 21/02282 |
| 2018/0228029 | A1* | 8/2018 | Moriyama ............. | C25D 5/605 |

FOREIGN PATENT DOCUMENTS

| CN | 105451455 | A | | 3/2016 | |
| CN | 106783120 | A | | 5/2017 | |
| CN | 109087902 | A | | 12/2018 | |
| JP | 2005026301 | A | * | 1/2005 | .......... H01L 23/3114 |
| JP | 2005166910 | A | | 6/2005 | |
| JP | 2016184754 | A | * | 10/2016 | ......... C23C 16/0272 |
| KR | 20130050056 | A | | 5/2013 | |
| WO | WO-2020123322 | A2 | * | 6/2020 | ........... C25D 17/001 |

OTHER PUBLICATIONS

First office action of Chinese application No. 201810928918.0 dated Oct. 8, 2019.

* cited by examiner

WIRING STRUCTURE, PREPARATION METHOD THEREOF, AND DISPLAY DEVICE

CROSS-REFERENCE TO RELATED APPLICATIONS

This disclosure is a 371 of PCT Patent Application No. PCT/CN2019/100659, filed Aug. 14, 2019, which claims priority to Chinese Patent Application No. 201810928918.0, filed on Aug. 15, 2018 and entitled "WIRING STRUCTURE, PREPARATION METHOD THEREOF, AND DISPLAY DEVICE", the entire contents of which are incorporated herein by reference.

TECHNICAL FIELD

The present disclosure relates to a wiring structure, a preparation method thereof, and a display device.

BACKGROUND

The signal line on a substrate may be prepared by an electroplating process. The electroplating process has the advantages of high deposition rate, lower cost, lower deposition temperature (room temperature), and the like. In particular, an electroplated copper layer has the advantages of better electrical conductivity, thermal conductivity, mechanical ductility and the like. Therefore, the copper electroplating technology has become one of the essential key technologies in modern microelectronics manufacturing. The copper electroplating is based on Faraday's laws of electrolysis. During electrolysis, the mass of a substance precipitated or dissolved on the electrode is proportional to the amount of electricity passing through the electrode. On an anode copper block, copper atoms lose electrons and become copper ions. On the contrary, on a cathode wafer, the copper ions gain the electrons and become the copper atoms.

SUMMARY

Embodiments of the present disclosure provide a wiring structure, a preparation method thereof, and a display device.

In a first aspect, a wiring structure is provided. The wiring structure includes: a substrate; a pre-arranged layer located on the substrate; and an electrode wiring covering the pre-arranged layer; wherein in a direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located.

Optionally, the wiring structure further includes a seed layer, wherein the seed layer is located between the pre-arranged layer and the electrode wiring.

Optionally, the pre-arranged layer is axisymmetric about a central line of the electrode wiring, wherein the central line is parallel to an extending direction of the electrode wiring.

Optionally, a cross section of the pre-arranged layer in a direction perpendicular to a plane on which the substrate is located and perpendicular to the extending direction of the electrode wiring is a trapezoid.

Optionally, a lower base of the trapezoid is proximal to the substrate.

Optionally, a material of the pre-arranged layer is one selected from a metal material, an organic material, or an inorganic material.

Optionally, an included angle between a side surface of the pre-arranged layer and the plane on which the substrate is located is in the range of 15° to 60°.

Optionally, a thickness of the pre-arranged layer is greater than 0.01 um and less than ½ of a thickness of the seed layer.

Optionally, a material of the electrode wiring is copper.

Optionally, in the extending direction of the electrode wiring, a length of the pre-arranged layer is greater than or equal to a length of the electrode wiring.

Optionally, a material of the seed layer includes copper or molybdenum.

Optionally, a material of the pre-arranged layer is selected from one of a metal material, an organic material, and an inorganic material, and a material of the electrode wiring is copper;

the pre-arranged layer is axisymmetric about a central line of the electrode wiring, and the central line is parallel to the extending direction of the electrode wiring;

a cross section of the pre-arranged layer in a direction perpendicular to the plane on which the substrate is located and perpendicular to the extending direction of the electrode wiring is a trapezoid; a lower base of the trapezoid is proximal to the substrate, and an included angle between the side surface of the pre-arranged layer and the plane on which the substrate is located is in the range of 15° to 60°; and a thickness of the pre-arranged layer is greater than 0.01 um and less than ½ of a thickness of the seed layer, and a length of the pre-arranged layer is greater than or equal to a length of the electrode wiring in the extending direction of the electrode wiring.

In a second aspect, a display device is provided. The display device includes a wiring structure, wherein the wiring structure includes:

a substrate;

a pre-arranged layer located on the substrate; and an electrode wiring covering the pre-arranged layer;

in a direction perpendicular to an extending direction of the electrode wiring and parallel to a plane on which the substrate is located, wherein an orthographic projection of the pre-arranged layer on the substrate is located within an orthographic projection of the electrode wiring on the substrate, and a side surface of the pre-arranged layer is inclined relative to the plane on which the substrate is located.

Optionally, the wiring structure further includes a seed layer, and the seed layer is located between the pre-arranged layer and the electrode wiring; a material of the seed layer includes one of copper and molybdenum; and a material of the pre-arranged layer is selected from one of a metal material, an organic material, and an inorganic material, and a material of the electrode wiring is copper;

the pre-arranged layer is axisymmetric about a central line of the electrode wiring, and the central line is parallel to the extending direction of the electrode wiring;

a cross section of the pre-arranged layer in a direction perpendicular to the plane on which the substrate is located and perpendicular to the extending direction of the electrode wiring is a trapezoid; a lower base of the trapezoid is proximal to the substrate, and an included angle between the side surface of the pre-arranged layer and the plane on which the substrate is located is in the range of 15° to 60°; and a thickness of the pre-arranged layer is greater than 0.01 um and less than ½ of a thickness of the seed layer, and a length of the pre-arranged layer is greater than or equal to a length of the electrode wiring in the extending direction of the electrode wiring.

In a third aspect, a preparation method of a wiring structure is provided. The preparation method includes:

providing a substrate;

forming a pre-arranged layer on the substrate;

forming retaining wall structures on both sides of the pre-arranged layer, wherein the retaining wall structures define a wiring position;

forming an electrode wiring at the wiring position; and removing the retaining wall structures;

wherein in a direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located.

Optionally, after forming the pre-arranged layer on the substrate and before forming the retaining wall structures on both sides of the pre-arranged layer, the method further includes:

forming a seed layer on the pre-arranged layer.

Optionally, forming the electrode wiring at the wiring position includes:

placing the substrate in a solution containing plating ions; and forming the electrode wiring at the wiring position by forming an electric field between the seed layer and the solution containing plating ions.

Optionally, forming the retaining wall structures on the both sides of the pre-arranged layer includes:

forming a photoresist layer on the seed layer; and patterning the photoresist layer to form at least two photoresist sub-patterns, the retaining wall structures including the at least two photoresist sub-patterns;

wherein two adjacent photoresist sub-patterns in the at least two photoresist sub-patterns are spaced apart from each other to define the wiring position, and at least a part of a surface of the seed layer is exposed at the wiring position.

Optionally, the method further includes:

removing the seed layer located outside the wiring position.

Optionally, forming the retaining wall structures on the both sides of the pre-arranged layer includes:

forming a photoresist layer on the seed layer; and patterning the photoresist layer to form at least two photoresist sub-patterns, the retaining wall structures including the at least two photoresist sub-patterns;

wherein two adjacent photoresist sub-patterns of the at least two photoresist sub-patterns are spaced apart from each other to define the wiring position. and at least part of surface of the seed layer is exposed at the wiring position; and the method further includes:

removing the seed layer located outside the wiring position.

DETAILED DESCRIPTION

For clearer descriptions of the principles, technical solutions, and advantages of the present disclosure, the embodiments of the present disclosure are described in detail below with reference to the accompanying drawings. It should be noted that, in the case of no conflict, the embodiments according to the present disclosure and the features in the embodiments may be freely combined with each other.

Figure 1:
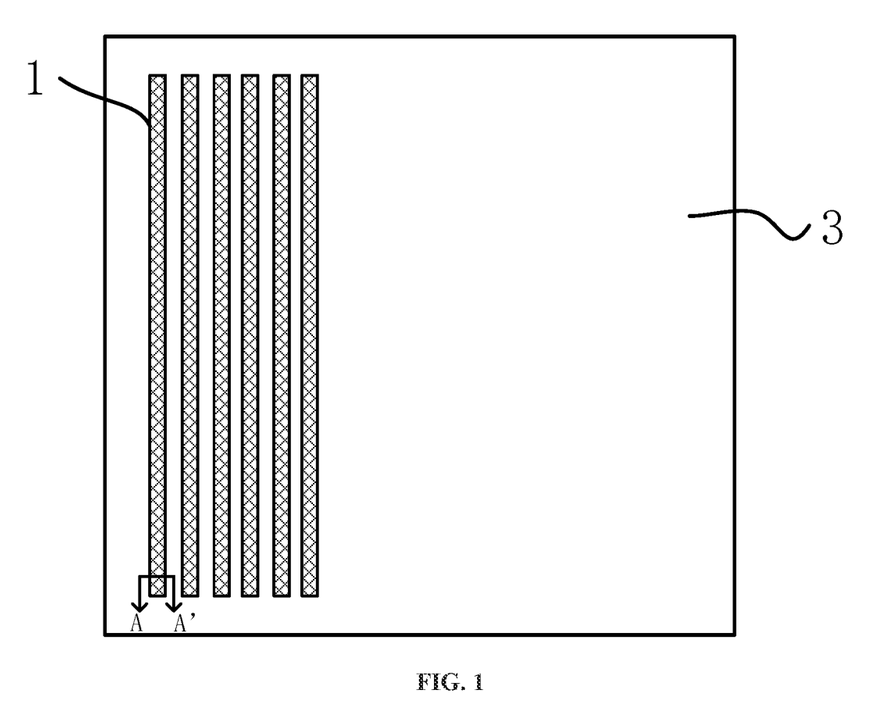
FIG. 1 is a schematic structural view of an electrode wiring according to an embodiment of the present disclosure.
Figure 2:
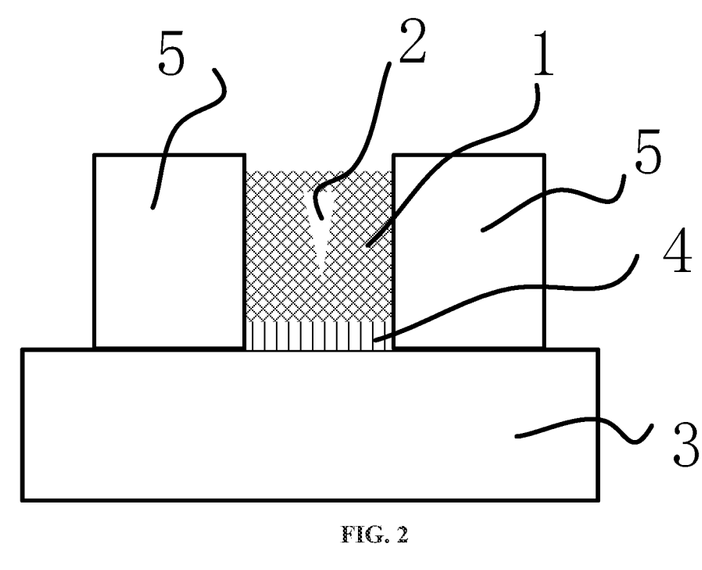
FIG. 2 is a cross-sectional view of the electrode wiring in FIG. 1 in the A-A' direction after electroplating is completed.

As shown in FIG. 1 and FIG. 2, in the process of forming an electrode wiring 1 by an electroplating process, a seed layer 4 is formed on a substrate 3 at first, retaining walls 5 are then formed, and afterwards the electrode wiring 1 is formed on the seed layer 4 by the electroplating process.

In the process of forming the electrode wiring by an electroplating process, the inventors have identified that due to fluctuations of current and non-uniformity of solution, copper ions may preferentially react in the vicinity of the retaining walls 5. In this case, the whole structure of the electrode wiring 1 is sealed, but holes 2 are still present inside the structure.

Besides, if holes 2 are present inside the prepared electrode wiring 1, the electrical conductivity of the electrode wiring 1 will be affected, resulting in an influence on the normal use of the electrode wiring 1.

Figure 3:
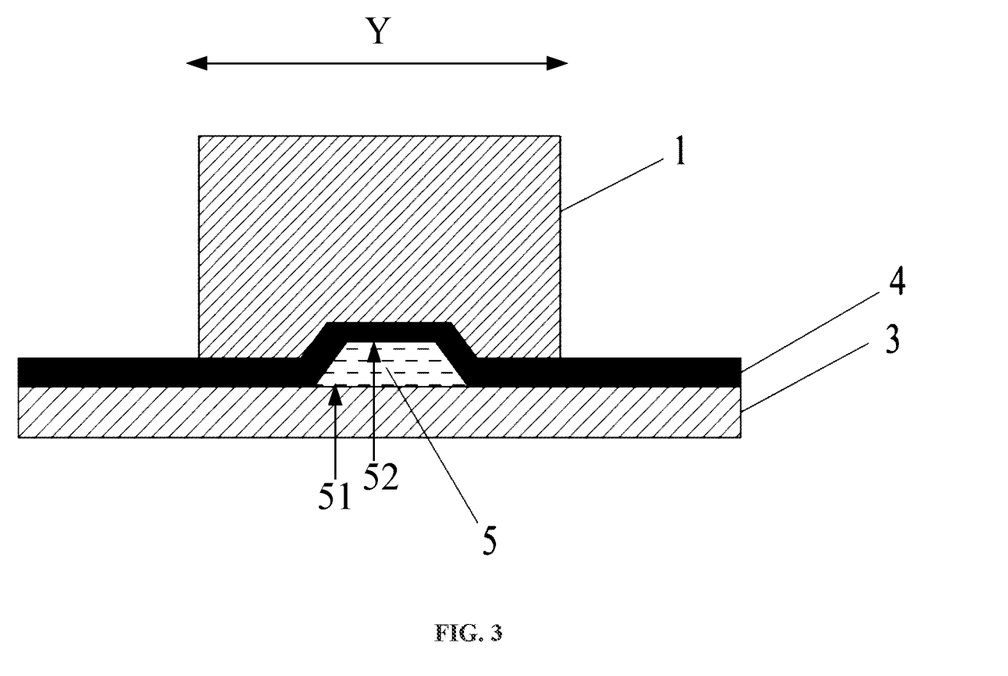
FIG. 3 is a cross-sectional view of a wiring structure according to an embodiment of the present disclosure.

An embodiment of the present disclosure provides a wiring structure. As shown in FIG. 3, the wiring structure includes a substrate 3, a pre-arranged layer 5 located on a surface of the substrate 3, and an electrode wiring 1 covering the pre-arranged layer 5.

In the process of forming the wiring structure shown in FIG. 3, the pre-arranged layer 5 may be formed on the substrate 3 at first, and the electrode wiring is then formed on the substrate 3 where the pre-arranged layer 5 is formed. In the wiring structure according to the embodiment of the present disclosure, by forming the pre-arranged layer 5 on the substrate 3, the pre-arranged layer 5 may guide a growth direction of the electrode wiring 1 thereabove during formation of the electrode wiring 1, and the copper ions are preferentially reduced to copper atoms in a region where the pre-arranged layer is located. In this way, the finally formed electrode wiring is dense and defect-free in the interior thereof.

A material of the substrate 3 may be selected from any material such as glass, silicon, plastic, or polyimide. Further, the material of the substrate 3 may also be other materials, which are not limited by embodiments of the present disclosure.

A material of the electrode wiring 1 is metal, for example, copper. The wiring structure also includes a seed layer 4. The seed layer 4 is located between the pre-arranged layer 5 and the electrode wiring 1. The electrode wiring 1 is formed on the seed layer 4 by an electroplating process. Optionally, a material of the electrode wiring 1 may also be conductive nonmetal (for example, indium tin oxide and the like), which is not limited by embodiments of the present disclosure.

A material of the pre-arranged layer 5 may be an inorganic material, for example, a nitrogen silicon compound or a silicon monoxide, or the material of the pre-arranged layer 5 may be a metal material, such as molybdenum, copper and aluminum, or the material of the pre-arranged layer 5 may be an organic material, for example, resin. The pre-arranged layer 5 is formed on the substrate 3 below the seed layer 4 on which the electrode wiring 1 needs to be electroplated, prior to formation of the seed layer 4.

In the embodiment of the present disclosure, a width of the pre-arranged layer 5 is not greater than a width of the electrode wiring 1. That is, in a direction (i.e., a width direction Y shown in FIG. 3) parallel to the plane on which the substrate is located and perpendicular to the extending direction (i.e., a length direction) of the electrode wiring 1, an orthographic projection of the pre-arranged layer 5 on the substrate 3 is located within an orthographic projection of the electrode wiring 1 on the substrate, such that the electrode wiring 1 may form a structure covering the pre-arranged layer 5 under guidance of the pre-arranged layer 5.

In some embodiments, the pre-arranged layer is axisymmetric about a central line of the electrode wiring, wherein the central line is parallel to an extending direction of the electrode wiring. Further, the pre-arranged layer may also be not axisymmetric about the central line of the electrode wiring, which is not limited by embodiments of the present disclosure.

Optionally, in the embodiment of the present disclosure, a shape of the pre-arranged layer 5 is not limited, as long as certain angle is defined between a side surface of the pre-arranged layer 5 and the substrate 3 (the side surface of the pre-arranged layer 5 is inclined relative to the plane on which the substrate 3 is located), such that the pre-arranged layer 5 may guide the growth direction of the electrode wiring 1.

In embodiments of the present disclosure, that one side surface of the pre-arranged layer 5 is inclined to the other side surface relative to the plane on which the substrate 3 is located, and the other side surface is inclined to the one side surface relative to the plane on which the substrate 3 is located is taken as an example. Further, the one side surface of the pre-arranged layer 5 may also be inclined distally from the other side surface relative to the plane on which the substrate 3 is located, and the other side surface is inclined distally from the one side surface relative to the plane on which the substrate 3 is located. Or the one side surface of the pre-arranged layer 5 is inclined to the other side surface relative to the plane on which the substrate 3 is located, and the other side surface is inclined distally from the one side surface relative to the plane on which the substrate 3 is located. Or the one side surface of the pre-arranged layer is inclined distally from the other side surface relative to the plane on which the substrate 3 is located, and the other side surface is inclined to the one side surface relative to the plane on which the substrate 3 is located.

The angle formed between the side surface of the pre-arranged layer 5 and the plane on which the substrate 3 is located is not limited by embodiments of the present disclosure. For example, an included angle between both sides of the pre-arranged layer 5 and a plane where the substrate 3 is located is in the range of 15° to 60° (that is, the included angle between the side surface of the pre-arranged layer 5 and the plane on which the substrate 3 is located is valued from 15° to 60°, and a cross-section of the pre-arranged layer 5 is a trapezoid (for example, an isosceles trapezoid), the copper ions are preferentially reduced to copper atoms in the region where the pre-arranged layer is located. In this way, the finally formed electrode wiring is dense and defect-free in the interior thereof When the included angle between the both sides of the pre-arranged layer 5 and the plane where the substrate 3 is located is greater than 60°, a guidance degree of the growth direction by the pre-arranged layer 5 may be excessively large, resulting in poor growth of an outer side of the electrode wiring 1. When the included angle between the both sides of the pre-arranged layer 5 and the plane on which the substrate 3 is located is less than 15°, the guidance degree of the growth direction by the pre-arranged layer 5 is too small, and a guidance effect of the pre-arranged layer 5 may not be achieved. In embodiments of the present disclosure, that a lower base 51 of the above trapezoid is proximal to the substrate 3 and an upper base 52 of the trapezoid is distal from the substrate 3 is taken as an example. Optionally, the upper base of the trapezoid may also be proximal to the substrate, and the lower base of the trapezoid is distal from the substrate.

It may be understood that when the materials of the pre-arranged layer 5 and the electrode wiring 1 are the same, for example, copper is adopted for both, in the finally formed wiring structure, the pre-arranged layer and the electrode wiring are defined as an integral structure, that is, the pre-arranged layer 5 also forms a part of the electrode wiring 1.

Still referring to FIG. 3, a material of the seed layer 4 may be a conductive metal material, for example, such a metal material as molybdenum, copper, or a copper alloy. When the seed layer 4 is made of the metal material, the seed layer 4 is formed on the surface of the substrate 3 and the surface of the pre-arranged layer 5 by a magnetron sputtering process.

It may be understood that when the materials of the seed layer 4 and the electrode wiring 1 are the same, for example, copper is adopted for both, in the finally formed wiring structure, the seed layer and the electrode wiring are defined as an integral structure, that is, the seed layer 4 also forms a part of the electrode wiring 1.

If the materials of at least one structure of the pre-arranged layer 5 and the seed layer 4 are the same as the material of the electrode wiring 1, the at least one structure may form a part of the electrode wiring 1. During the normal use of the electrode wiring 1, the at least one structure is configured to transmit an electrical signal together with the electrode wiring 1. Besides, the entirety formed by the at least one structure and the electrode wiring 1 has a larger section area (greater than the section area of the electrode wiring 1 per se), and a smaller resistance (less than the resistance of the electrode wiring 1 per se), resulting in a better transmission effect of the electrical signal.

In drawings of embodiments of the present disclosure, that a thickness of the pre-arranged layer 5 is greater than a thickness of the seed layer. Optionally, the thickness of the pre-arranged layer 5 is greater than 0.01 um and less than ½ of the thickness of the seed layer, such that the pre-arranged layer 5 may guide formation of the electrode wiring 1.

It should be noted that if the thickness of the pre-arranged layer 5 is less than 0.01 um, the pre-arranged layer 5 is too thin, in one aspect, it is difficult to form on the substrate 3 in the production process on one hand, and in another aspect, the pre-arranged layer 5 may not effectively guide the formation of the electrode wiring 1. If the thickness of the pre-arranged layer 5 is greater than ½ of the thickness of the seed layer 4, the pre-arranged layer 5 is too thick, it is not convenient to form the seed layer 4, and the seed layer 4 on the pre-arranged layer 5 are prone to be subject to poor overlapping, and as a result, the seed layer 4 may suffer from such adverse phenomena as breakage or the like.

In the embodiment of the present disclosure, a length of the pre-arranged layer 5 may be the same as or greater than a length of the electrode wiring 1. In the embodiment of the present disclosure, the case where the length of the pre-arranged layer 5 is equal to the length of the electrode wiring 1 is taken as an example.

In summary, in the wiring structure according to the embodiment of the present disclosure, by forming the pre-arranged layer on the substrate, the pre-arranged layer may guide a growth direction of the electrode wiring thereabove during formation of the electrode wiring, and the copper ions are preferentially reduced to copper atoms in a region where the pre-arranged layer is located. In this way, the finally formed electrode wiring is dense and defect-free in the interior thereof, and no holes are present inside the electrode wiring.

When no holes are present inside the electrode wiring, the electrical conductivity of the electrode wiring is better, and the normal use of the electrode wiring may not be affected.

An embodiment of the present disclosure provides a display device. The display device includes the above wiring structure.

Exemplarily, the display device may be any product or component with a display function, such as a liquid crystal panel, electronic paper, an organic light emitting diode (OLED) panel, an light emitting diode (LED) panel, a mobile phone, a tablet computer, a television, a display, a laptop, a digital photo frame, or a navigator.

In summary, the display device according to embodiments of the present disclosure includes a wiring structure according to the embodiments of the present disclosure. Besides, the electrode wiring in the wiring structure is dense and defect-free, and no holes are present inside the electrode wiring. Therefore, the normal use of the display device according to the embodiments of the present disclosure may not be affected by the electrode wiring.

An embodiment of the present disclosure provides a preparation method of the above wiring structure. The preparation method is described as follows.

Figure 4:
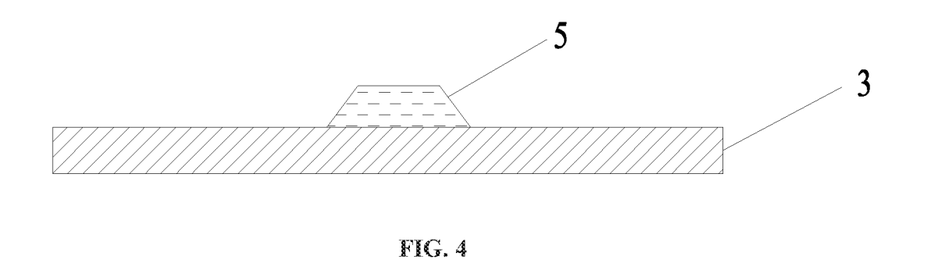
FIG. 4 is a cross-sectional view of a substrate after a pre-arranged layer is formed in a preparation method of a wiring structure according to an embodiment of the present disclosure.

At first, as shown in FIG. 4, the substrate 3 is provided; and the pre-arranged layer 5 is formed on the substrate 3.

Exemplarily, the length of the pre-arranged layer 5 may be equal to or greater than a length of the wiring position, and the width of the pre-arranged layer 5 is not greater than a width of the wiring position, that is, the formed electrode wiring covers the pre-arranged layer 5, such that the electrode wiring may be formed under guidance of the pre-arranged layer 5; besides, the width of the pre-arranged layer 5 may be adjusted according to the current density and solute concentration in the electroplating process so as to guide formation of the electrode wiring 1.

If the material of the pre-arranged layer 5 is an inorganic material, for example, a nitrogen silicon compound or a silicon monoxide, the pre-arranged layer 5 is formed at the wiring position by a chemical vapor deposition process; and if the material of the pre-arranged layer 5 is a metal material, such as molybdenum, copper, aluminum, or the like, the pre-arranged layer 5 is formed at the wiring position by a magnetron sputtering process.

Figure 5:
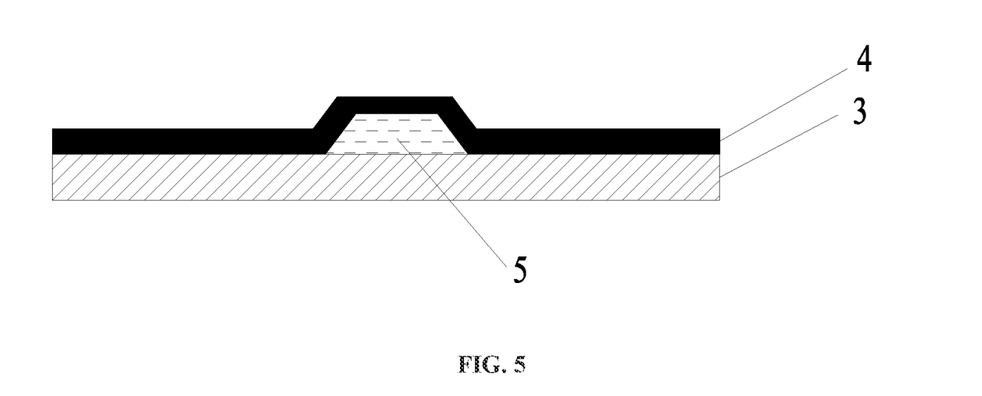
FIG. 5 is a cross-sectional view of a substrate after a seed layer is formed in a preparation method of the wiring structure according to an embodiment of the present disclosure.

After the pre-arranged layer 5 is formed, as shown in FIG. 5, the seed layer 4 is formed on the surface of the substrate 3 and the surface of the pre-arranged layer 5.

Exemplarily, the seed layer 4 may be made of molybdenum, copper or a metal material, for example, a copper alloy; and the seed layer 4 may be formed on the surface of the substrate 3 and the surface of the pre-arranged layer 5 by the magnetron sputtering process.

Figure 6:
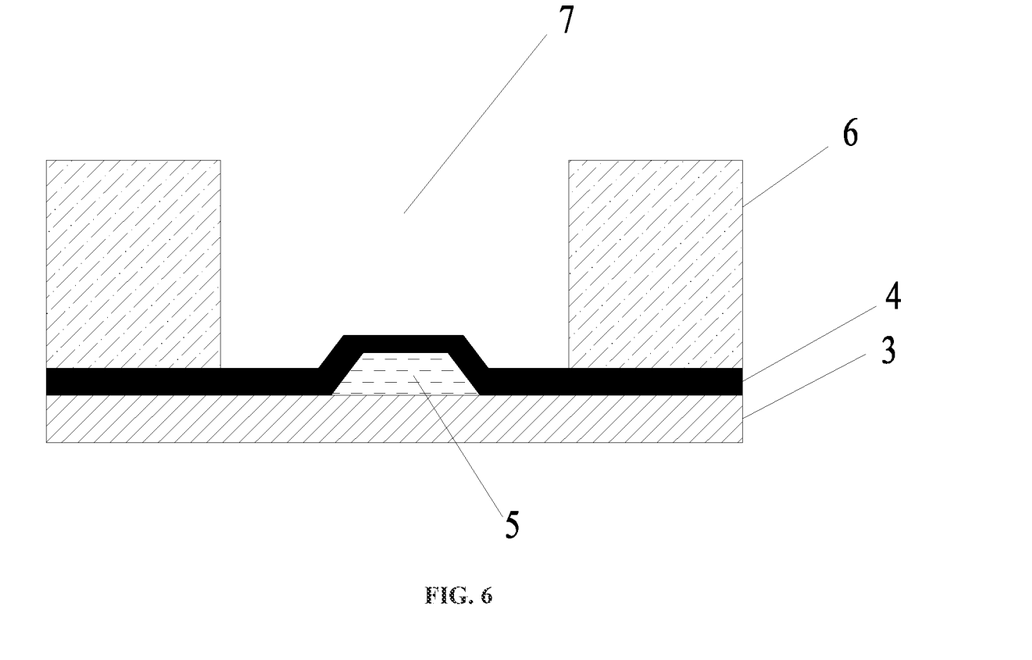
FIG. 6 is a cross-sectional view after retaining walls are formed in a preparation method of the wiring structure according to an embodiment of the present disclosure.
Figure 8:
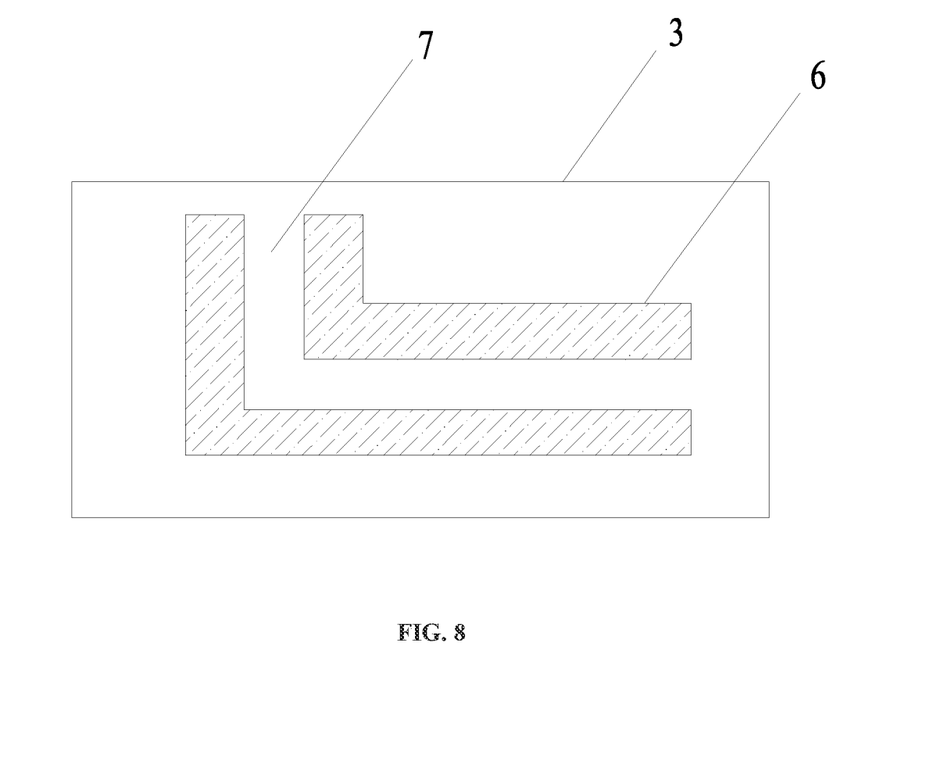
FIG. 8 is a plan view before an electrode wiring is formed in a preparation method of the wiring structure according to an embodiment of the present disclosure.

After the seed layer 4 is formed, as shown in FIG. 6 and FIG. 8, retaining wall structures 6 are formed on both sides of the pre-arranged layer, and the retaining wall structures 6 define a wiring position 7.

The material of the retaining wall structures 6 may be photoresist. During formation of the retaining wall structures 6, a photoresist layer may be formed on the seed layer 4 first, and thereafter, a patterning process is performed on the photoresist layer to form at least two photoresist sub-patterns. The retaining wall structures 6 include the at least two photoresist sub-patterns. Two adjacent photoresist sub-patterns are spaced apart from each other to define the wiring position 7. At least part of surface of the seed layer 4 is exposed at the wiring position 7 (the embodiment of the present disclosure takes a part of the surface as an example). It is apparent that a groove is formed between two adjacent photoresist sub-patterns by the patterning process, so as to limit the position where the electrode wiring 1 grows and define the thickness of the electrode wiring 1 during electroplating.

Exemplarily, patterning the photoresist layer includes: exposing the photoresist layer by a mask, such that the photoresist layer forms an exposure region and a non-exposure region; and removing the photoresist in one of the exposure region and the non-exposure region by a developing process, while the photoresist in the other region is reserved. It should be noted that the photoresist may be positive or negative. If the photoresist is positive, the photoresist in the exposure region is removed after the above developing process, and the photoresist in the non-exposure region is reserved. If the photoresist is negative, the photoresist in the non-exposure region is removed after the above developing process, and the photoresist in the exposure region is reserved.

Optionally, a material of the above retaining wall structures may not be photoresist, for example, the material of the above retaining wall structures may be inorganic matter, organic matter or the like. During the formation of the above retaining wall structures, a retaining wall material layer may be formed on the seed layer 4 at first, and then the patterning process is performed on the retaining wall material layer to form at least two retaining wall sub-patterns. The retaining wall structure 6 includes at least two retaining wall sub-patterns; and two adjacent retaining wall sub-patterns are spaced apart from each other to define the wiring position 7.

Exemplarily, patterning the retaining wall material layer includes: coating a layer of photoresist on the retaining wall material layer; exposing the photoresist by a mask, such that the photoresist forms an exposure region and a non-exposure region; and removing the photoresist in one of the exposure region and the non-exposure region by a developing process, while the photoresist in the other region is reserved; etching the region on the retaining wall material layer not covered by the photoresist; and peeling the photoresist on the retaining wall material layer after completing the etching, to obtain the retaining wall structure.

Figure 7:
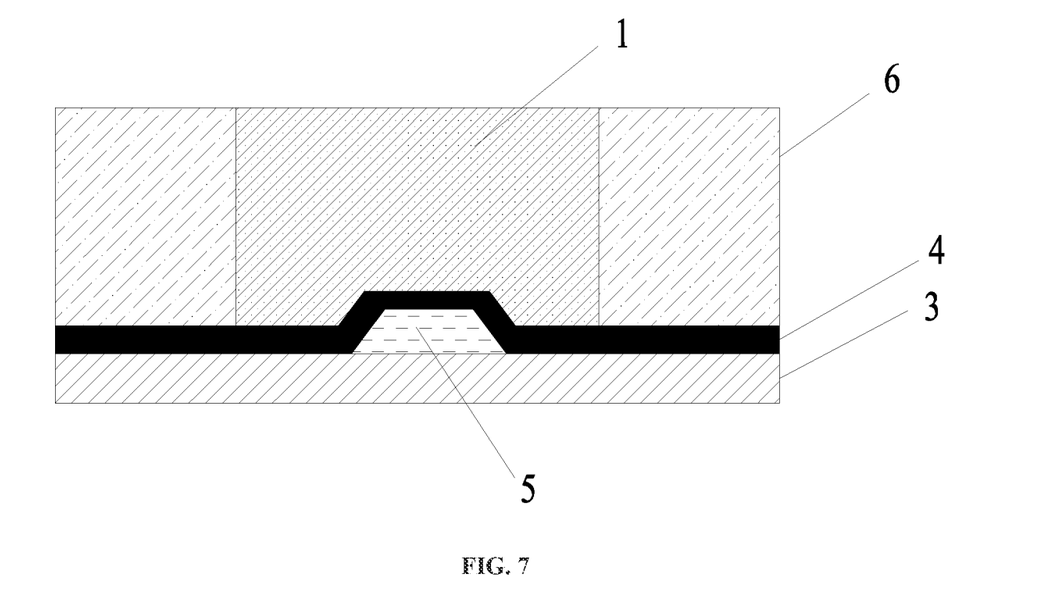
FIG. 7 is a cross-sectional view after an electrode wiring is formed in a preparation method of the wiring structure according to an embodiment of the present disclosure.
Figure 9:
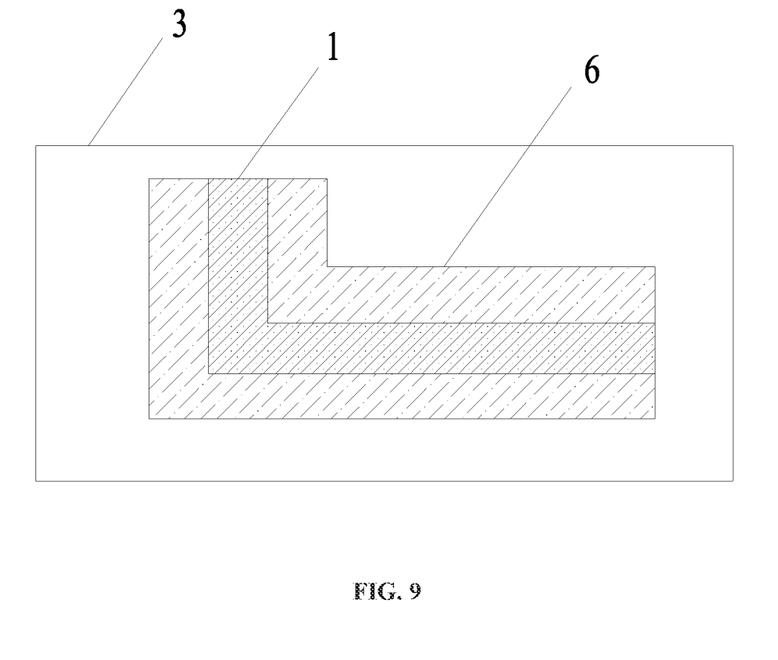
FIG. 9 is a plan view after an electrode wiring is formed in a preparation method of the wiring structure according to an embodiment of the present disclosure.

After the retaining wall structures are formed, as shown in FIG. 7 and FIG. 9, the electrode wiring 1 is formed on the seed layer 4 at the wiring position by the electroplating process.

Exemplarily, by taking a copper electrode wiring of the electrode wiring 1 as an example, the structure shown in FIG. 6 is put into a solution containing copper ions, the seed layer 4 on the substrate 3 is used as a cathode, the solution containing copper ions is used as an anode, and a voltage is applied to the anode and the cathode. Since the substrate 3 is coated with the retaining walls 6, the copper ions may only obtain electrons at the wiring position 7 of the substrate 3 and thus reduced to copper atoms, which are thereby gradually deposited on the seed layer 4 in the region of the wiring position 7. In the process of forming the copper electrode wiring, the pre-arranged layer 5 may guide a deposition direction of the copper ions, such that the copper ions are preferentially reduced to the copper atoms in the region where the pre-arranged layer 5 is located. Therefore, the finally formed electrode wiring 1 is dense and defect-free in the interior thereof, and thus insufficient electroplating in the interior of the electrode wiring 1 is prevented.

The electroplating process has the characteristics of high deposition rate, lower cost and lower deposition temperature (room temperature). The copper electrode wiring prepared by the electroplating process has better electrical conductivity, thermal conductivity and mechanical ductility.

After the electrode wiring 1 is formed, the retaining walls 6 and the seed layer 4 located outside the wiring position 7 are removed in order to complete the preparation of the wiring structure.

According to the preparation method of the wiring structure according to the present disclosure, by forming the pre-arranged layer 5 on the substrate 3, the electrode wiring 1 may be guided by the pre-arranged layer 5 during formation of the electrode wiring 1 by the electroplating process, such that the copper ions are preferentially reduced to the copper atoms in the region where the pre-arranged layer 5 is located, and the risk that the holes are formed in the middle of the electrode wiring due to preferential crystallization on the edge of the retaining walls 6 is avoided, thereby forming the dense and defect-free electrode wiring.

It should be noted that the method embodiments according to the present disclosure can be cross-referenced with the corresponding wiling structure embodiments, which is not limited in the embodiments of the present disclosure. The sequence of the steps in the method embodiments may be adjusted appropriately, and the steps may be deleted or added according to the situation. Within the technical scope disclosed in the present disclosure, any variations of the method easily derived by a person of ordinary skill in the art shall fall within the protection scope of the present disclosure, which is not repeated here.

It should be noted that, in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. In addition, it may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

Although the embodiments disclosed by the present disclosure are as described above, the content described is only the embodiments adopted for facilitating the understanding of the present disclosure, and is not intended to limit the present disclosure. Any person skilled in the art to which the present disclosure belongs may make any modifications and changes in the form and details of implementation without departing from the spirit and scope disclosed in the present disclosure, but the protection scope of the present disclosure shall still be subject to the scope defined by the appended claims.

What is claimed is:

1. A wiring structure, comprising,
 a substrate;
 a pre-arranged layer located on the substrate;
 an electrode wiring covering the pre-arranged layer; and
 a seed layer located between the pre-arranged layer and the electrode wiring;
wherein
 in a direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located;
 an included angle between the side surface of the pre-arranged layer and the plane on which the substrate is located is in the range of 15° to 60°, a thickness of the pre-arranged layer is greater than 0.01 um and less than ½ of a thickness of the seed layer, such that the pre-arranged layer guides formation of the electrode wiring.

2. The wiring structure according to claim 1, wherein the pre-arranged layer is axisym metric about a central line of the electrode wiring, the central line being parallel to the extending direction of the electrode wiring.

3. The wiring structure according to claim 1, wherein a cross section of the pre-arranged layer in a direction perpendicular to the plane on which the substrate is located and perpendicular to the extending direction of the electrode wiring is a trapezoid.

4. The wiring structure according to claim 1, wherein a material of the pre-arranged layer is one selected from a metal material, an organic material, and an inorganic material.

5. The wiring structure according to claim 1, wherein a material of the electrode wiring is copper.

6. The wiring structure according to claim 1, wherein a material of the seed layer comprises one of copper and molybdenum.

7. A display device, comprising a wiring structure, wherein the wiring structure comprises:

a substrate;
a pre-arranged layer located on the substrate;
an electrode wiring covering the pre-arranged layer; and
a seed layer located between the pre-arranged layer and the electrode wiring;
wherein
in a direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located;
an included angle between the side surface of the pre-arranged layer and the plane on which the substrate is located is in the range of 15° to 60°, a thickness of the pre-arranged layer is greater than 0.01 um and less than ½ of a thickness of the seed layer, such that the pre-arranged layer guides formation of the electrode wiring.

8. A preparation method of a wiring structure, comprising:
providing a substrate;
forming a pre-arranged layer on the substrate;
forming a seed layer on the pre-arranged layer;
forming retaining wall structures on both sides of the pre-arranged layer, wherein the retaining wall structures define a wiring position;
forming an electrode wiring at the wiring position; and
removing the retaining wall structures;
wherein in a direction perpendicular to an extending direction of the electrode wiring and parallel to a plane on which the substrate is located, an orthographic projection of the pre-arranged layer on the substrate is located within an orthographic projection of the electrode wiring on the substrate, and a side surface of the pre-arranged layer is inclined relative to the plane on which the substrate is located;
an included angle between the side surface of the pre-arranged layer and the plane on which the substrate is located is in the range of 15° to 60°, a thickness of the pre-arranged layer is greater than 0.01 um and less than ½ of a thickness of the seed layer, such that the pre-arranged layer guides formation of the electrode wiring.

9. The preparation method of the wiring structure according to claim 8, wherein forming the electrode wiring at the wiring position comprises:
placing the substrate in a solution containing plating ions; and
forming the electrode wiring at the wiring position by forming an electric field between the seed layer and the solution containing plating ions.

10. The preparation method of the wiring structure according to claim 8, wherein forming the retaining wall structures on the both sides of the pre-arranged layer comprises:
forming a photoresist layer on the seed layer; and
patterning the photoresist layer to form at least two photoresist sub-patterns, the retaining wall structures comprising the at least two photoresist sub-patterns;
wherein two adjacent photoresist sub-patterns in the at least two photoresist sub-patterns are spaced apart from each other to define the wiring position, and at least a part of a surface of the seed layer is exposed at the wiring position.

11. The preparation method of the wiring structure according to claim 8, further comprising:
removing the seed layer located outside the wiring position.

12. The wiring structure according to claim 3, wherein a lower base of the trapezoid is proximal to the substrate.

13. The wiring structure according to claim 1, wherein in the extending direction of the electrode wiring, a length of the pre-arranged layer is greater than or equal to a length of the electrode wiring.

14. The wiring structure according to claim 6, wherein a material of the pre-arranged layer is selected from one of a metal material, an organic material, and an inorganic material, and a material of the electrode wiring is copper;
the pre-arranged layer is axisymmetric about a central line of the electrode wiring, and the central line is parallel to the extending direction of the electrode wiring;
a cross section of the pre-arranged layer in a direction perpendicular to the plane on which the substrate is located and perpendicular to the extending direction of the electrode wiring is a trapezoid; a lower base of the trapezoid is proximal to the substrate; and
a thickness of the pre-arranged layer is greater than 0.01 um and less than ½ of a thickness of the seed layer, and a length of the pre-arranged layer is greater than or equal to a length of the electrode wiring in the extending direction of the electrode wiring.

15. The display device according to claim 7, wherein the wiring structure further comprises a seed layer, and the seed layer is located between the pre-arranged layer and the electrode wiring; a material of the seed layer comprises one of copper and molybdenum; and a material of the pre-arranged layer is selected from one of a metal material, an organic material, and an inorganic material, and a material of the electrode wiring is copper;
the pre-arranged layer is axisymmetric about a central line of the electrode wiring, and the central line is parallel to the extending direction of the electrode wiring;
a cross section of the pre-arranged layer in a direction perpendicular to the plane on which the substrate is located and perpendicular to the extending direction of the electrode wiring is a trapezoid; a lower base of the trapezoid is proximal to the substrate; and
a thickness of the pre-arranged layer is greater than 0.01 um and less than ½ of a thickness of the seed layer, and a length of the pre-arranged layer is greater than or equal to a length of the electrode wiring in the extending direction of the electrode wiring.

16. The preparing method for a wiring structure according to claim 9, wherein forming the retaining wall structures on the both sides of the pre-arranged layer comprises:
forming a photoresist layer on the seed layer; and
patterning the photoresist layer to form at least two photoresist sub-patterns, the retaining wall structures comprising the at least two photoresist sub-patterns;
wherein two adjacent photoresist sub-patterns of the at least two photoresist sub-patterns are spaced apart from each other to define the wiring position, and at least a part of a surface of the seed layer is exposed at the wiring position; and
the method further comprises:
removing the seed layer located outside the wiring position.

* * * * *